US009915570B1

(12) United States Patent
Gennello

(10) Patent No.: US 9,915,570 B1
(45) Date of Patent: Mar. 13, 2018

(54) METHOD AND SYSTEM FOR MANAGING COOLING DISTRIBUTION

(71) Applicant: DCIM Solutions, LLC, Austin, TX (US)

(72) Inventor: Anthony Gennello, Marlton, NJ (US)

(73) Assignee: DCIM Solutions, LLC, Austin, TX (US)

( * ) Notice: Subject to any disclaimer, the term of this patent is extended or adjusted under 35 U.S.C. 154(b) by 0 days.

(21) Appl. No.: 15/594,155

(22) Filed: May 12, 2017

Related U.S. Application Data

(60) Provisional application No. 62/376,518, filed on Aug. 18, 2016.

(51) Int. Cl.
| | | |
|---|---|---|
| *G01N 25/20* | (2006.01) | |
| *G01K 3/00* | (2006.01) | |
| *G01K 7/00* | (2006.01) | |
| *G01K 13/02* | (2006.01) | |
| *H05K 7/20* | (2006.01) | |

(52) U.S. Cl.
CPC ....... *G01K 13/028* (2013.01); *H05K 7/20736* (2013.01); *H05K 7/20836* (2013.01); *G01K 2013/024* (2013.01)

(58) Field of Classification Search
USPC ............................ 374/166, 43, 143, 142, 115
See application file for complete search history.

(56) References Cited

U.S. PATENT DOCUMENTS

| | | | |
|---|---|---|---|
| 4,934,189 A | 6/1990 | Tanimoto et al. | |
| 8,280,647 B2 * | 10/2012 | Stadler | F01D 17/08 |
| | | | 123/478 |
| 9,062,887 B2 * | 6/2015 | Montminy | B64F 1/364 |
| 9,217,362 B2 * | 12/2015 | Wang | F02B 37/013 |
| 9,261,542 B1 | 2/2016 | West | |
| 9,322,323 B2 * | 4/2016 | Panciroli | F02B 37/127 |
| 2004/0069069 A1 * | 4/2004 | Gysling | G01F 1/666 |
| | | | 73/736 |
| 2004/0168523 A1 * | 9/2004 | Fernald | G01F 1/666 |
| | | | 73/861.01 |

(Continued)

FOREIGN PATENT DOCUMENTS

WO     2015184956 A1      12/2015

*Primary Examiner* — Mirellys Jagan
(74) *Attorney, Agent, or Firm* — DuBois, Bryant & Campbell, LLP; William D. Wiese

(57) ABSTRACT

Accurate measurement and monitoring of a computer room air conditioning unit's cooling production, distribution, and consumption is necessary to optimize effectiveness and efficiency and minimize redundancy. A mass air flow monitoring device comprises an array of sensor modules and a controller module with display, user interface, and I/O for third party connectivity. The device monitors temperature, pressure, water content, and quantity of airflow in a CRAC's supply air stream and return air stream and compares the two measurements to determine the amount of energy, or enthalpy, put into or taken out of the air. The result, displayed in watts, allows for the efficient control of production, distribution, and usage of supply air from the CRAC unit. Over or under provisioning can be quickly identified and corrected and, when used in conjunction with power consumption monitoring, a "watts of cooling for watts of power consumption" efficiency metric can be provided.

20 Claims, 3 Drawing Sheets

(56) References Cited

U.S. PATENT DOCUMENTS

| | | | |
|---|---|---|---|
| 2005/0005711 A1* | 1/2005 | Gysling | G01F 1/363 73/861.08 |
| 2008/0208483 A1* | 8/2008 | Loose | G01F 1/666 702/22 |
| 2010/0058832 A1* | 3/2010 | Onishi | F01N 9/002 73/23.31 |
| 2010/0153057 A1 | 6/2010 | Bersch et al. | |
| 2015/0013646 A1* | 1/2015 | Qi | G01F 23/263 123/478 |
| 2015/0240771 A1* | 8/2015 | Pursifull | F02M 65/002 73/114.41 |
| 2016/0032872 A1* | 2/2016 | Dudar | F02M 25/0809 73/40.5 R |
| 2016/0040630 A1* | 2/2016 | Li | F02M 25/0809 73/40.5 R |
| 2016/0178417 A1* | 6/2016 | Bleile | F02D 41/0055 73/1.35 |
| 2016/0187066 A1* | 6/2016 | Newman | F28C 3/06 165/104.31 |
| 2016/0282006 A1* | 9/2016 | Rock | F24F 11/0086 |
| 2016/0326974 A1* | 11/2016 | Lahti | F02D 41/0072 |

\* cited by examiner

METHOD AND SYSTEM FOR MANAGING COOLING DISTRIBUTION

PRIORITY STATEMENT UNDER 35 U.S.C. § 119 & 37 C.F.R. § 1.78

This non-provisional application claims priority based upon prior U.S. Provisional Patent Application Ser. No. 62/376,518 filed Aug. 18, 2016 in the name of Anthony Gennello entitled "METHOD AND SYSTEM FOR MANAGING COOLING DISTRIBUTION," the disclosure of which is incorporated herein in its entirety by reference as if fully set forth herein.

BACKGROUND OF THE INVENTION

Historically, cooling a data center was a straight-forward matter. Data centers used to generate less power and, consequently, less heat per square foot than modern counterparts. As a result, a technician could simply offset the heat from the equipment by adding additional computer room air conditioning (CRAC) units inside the data center, and there was little need to develop or implement a complex system for monitoring and controlling data room cooling. However, the increase in computer room power consumption, density, and heat generation now requires a more scientific approach to monitoring and controlling computer room data center than ever before.

Because of the density of equipment in most data rooms, technicians have implemented a variety of techniques to improve cooling. For example, in many instances, data equipment is placed on raised floors, two tiles apart, with their air intakes facing each other to achieve the air circulation necessary to keep the computer room cool. In this configuration, CRAC units pump cool air through perforated floor tiles between the racks, the computers and racks intake the cool air and exhaust hot air into the opposing, hot aisle. Computer room air conditioning units on the floor then pull in the hot air exhausted into the hot aisles, and release it underneath the floor tiles, completing the cycle. In this way, a series of CRAC units can keep cool air running through the system and help keep a steady airflow through the environment.

Alternatively, technicians may turn the area above racks into a hot air plenum by placing ducts and more CRAC units in this space. In this case, hot air escapes into the plenum to be pushed back into the system, below the floor, where it can be cooled and released back into the computer room. There are also a variety of other techniques and technologies for cooling data centers. However, in each case careful monitoring and control are required to be effective, and current methods of monitoring and control are obsolete, inefficient and ineffective for several reasons.

First, most current methods of cooling capacity measurement consist of the use of a balometer capture hood with pitot and temperature, humidity, and pressure sensors. Multiple readings are taken with the single device at multiple locations within the sampling area. The readings are then used to manually calculate the cooling measurements. This method is labor intensive, evasive, time consuming, and often inaccurate since, for example, the person taking the measurements may block or divert airflow and affect the results. Also, because of the time involved to take multiple measurements and calculate the results, meaningful information is not available in real time. CRAC manufactures may also attempt to calculate cooling parameters using temperature, humidity, and fan speed. However, this method also suffers from the inability to provide real time data.

Second, current methods of determining effective CRAC unit utilization can be very imprecise. The common methodology is to compare temperature change through the CRAC unit and compare it to the amount of compressor or chill water valve and fan speed. This method does not take into account all of the components required to measure heat capacity—temperature, pressure, water content, and quantity of airflow—and, therefore, cannot fully provide meaningful information about cooling capacity.

In addition, there is currently no efficient method of measuring mass air flow cooling distribution at vents or perforated raised floor tiles used in data rooms. The closest methodology only measures velocity and/or volume of air by using a pinwheel or hot wire anemometer, or a flow hood balometer. The anemometer displays only velocity of air (feet per minute) requiring several sample readings to be taken, and then airflow must be calculated (cubic feet per minute) using the average readings to the sampling area. The flow hood balometer uses a pitot array to measure pressure differentiation and temperature in a specified sampling area to provide a volume of airflow. As will be appreciated by those skilled in the art, neither of these methods account for the four components of mass air flow and are, therefore, ineffective means of measurement. The metrics used (velocity and airflow volume) are not consistent with the requirements for measuring cooling capacity metric (tons or watts) or heat load.

The only way to measure heat load and cooling consumption is to monitor the metered power consumption. Typical data center computers are mounted in a rack or cabinet. Generally, the rack orientates the equipment in a front to rear position. Data center operational best practices promotes the inflow of cooling into the front of the equipment/racks and the exhaust air out of the rear. As a result, mass air flow detection of heat load does not exist in the data center operation methodology. Consequently, there is no effective method for measuring the mass air flow and enthalpy change of data center load.

There is a need, therefore, for a method and system that provides an effective measurement and metric for cooling infrastructure and, more specifically, that can compare actual cooling capacity production to cooling infrastructure power consumption. Such a comparison will present an efficiency metric watts of cooling per watts of power consumption (watts per watts).

SUMMARY

Various embodiments of the present invention, sometimes referred to as a cooling enthalpy gauge (CEG), include an array of sensor modules and a controller module with display, user interface and I/O for third party connectivity. Four airflow components are measured: temperature, pressure, water content, and quantity of airflow. The combination of the four components is referred to as mass air flow (MAF). This system measures the MAF as it enters and exits the CRAC. The system then compares the two measurements to determine the amount of energy, or enthalpy, put into or taken out of the air. The enthalpy measurement is converted to and displayed as the watt metric. Having a common watt metric for the three facets of cooling usage (production, distribution, and usage) simplifies provisioning of cooling to a heat load. Over or under provisioning can be quickly identified and corrected, yielding effective and efficient cooling. When used in conjunction with power consumption monitoring, embodiments of the present invention can provide a "watts of cooling for watts of power consumption" efficiency metric for cooling infrastructure.

The foregoing has outlined rather broadly certain aspects of the present invention in order that the detailed description of the invention that follows may better be understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTIONS OF DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

This invention relates to the measuring and monitoring of cooling and heat load in a computer data center or equipment room. The accurate measurement of cooling production, distribution, and usage can identify inefficient implementation of cooling systems. The configuration and use of the presently preferred embodiments are discussed in detail below. It should be appreciated, however, that the present invention provides many applicable inventive concepts that can be embodied in a wide variety of contexts other than managing and controlling cooling distribution. Accordingly, the specific embodiments discussed are merely illustrative of specific ways to make and use the invention, and do not limit the scope of the invention. In addition, the following terms shall have the associated meaning when used herein:

"BMS" means any building management system used to gather data from and control building related systems and components such as power, cooling and ventilation, lights, physical access, cameras and other security systems like fire/smoke detectors, rodent controls etc., but typically excluding managing or controlling the IT environment;

"CRAC" means a computer room air conditioning device installed in data center that uses a self-contained refrigeration cycle to remove heat from the room and send it away from the data center through a cooling medium;

"CRAW" means a computer room air handling device installed in the data center that uses circulating chilled water to remove heat;

"DCIM" means any data center infrastructure management system that has the capability to manage both the IT and facilities domains through a single controller;

"enthalpy" means the total quantity of energy used to heat or cool a substance between two temperatures;

"IT" means information technology; and

"mass air flow" means temperature, pressure, water content and quantity of air from computer room air conditioners, air handlers, distribution vents or IT equipment fans.

Figure 1:
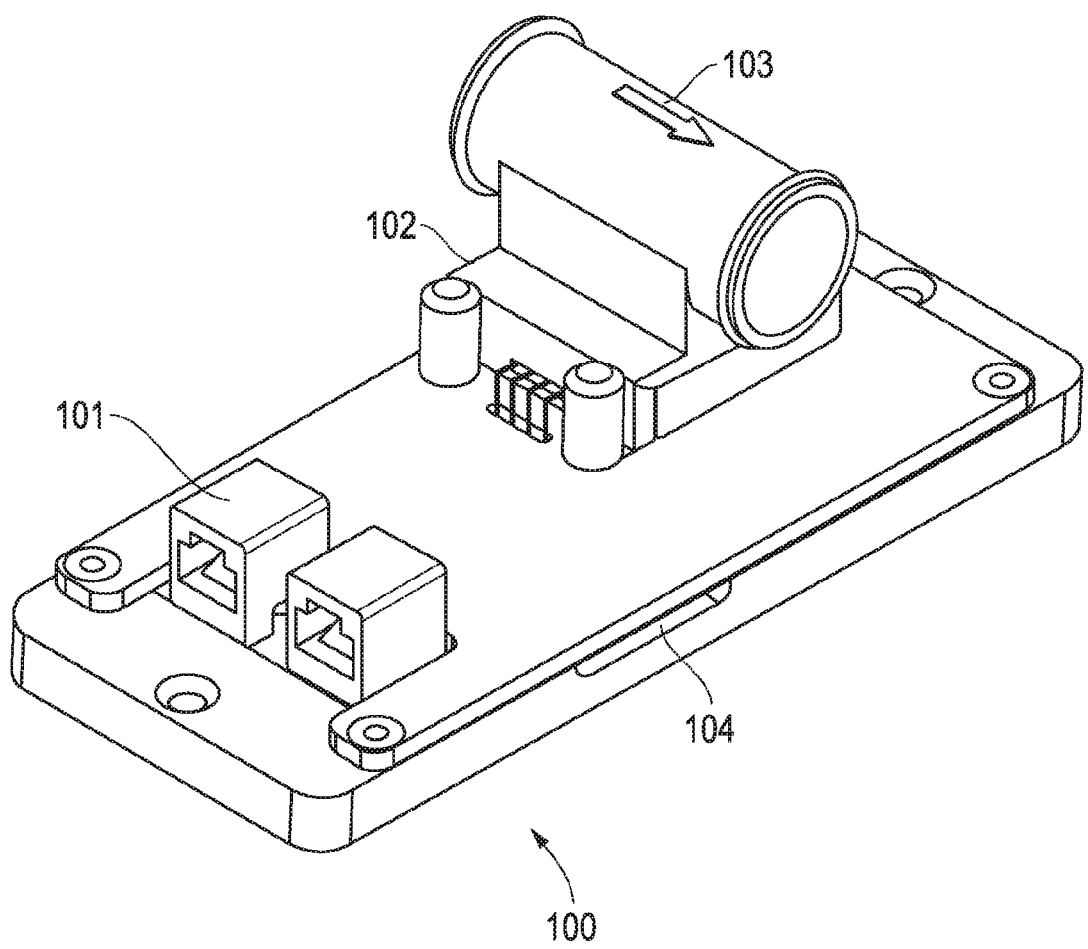
FIG. 1 is a depiction of one embodiment of a mass air flow sensor module used in array.

Referring now to FIG. 1 which depicts one embodiment of a mass air flow sensor module 100 used in an array of the present invention. The module 100 is comprised of one or more communications ports 101. The port 101 may be male or female, but female connectors are much more common. Computer ports in common use cover a wide variety of shapes such as round (PS/2, etc.), rectangular (FireWire, etc.), square (telephone plug), trapezoidal, etc.

The module 100 is also equipped with a mass air flow sensor 102 in which the air traverses through the sensor in the direction depicted 103. The mass air flow sensor 102 does not measure the volume of the air passing through the tube, it measures the mass of air flowing through the sensor 102 per unit time. In other words, the mass air flow sensor is simply an application of a mass flow meter for a special medium, air.

Embodiments of the sensor 100 are also configured with a combination of one or more of a temperature sensor, relative humidity sensor, and barometric sensor or other sensors known in the art.

Figure 2:
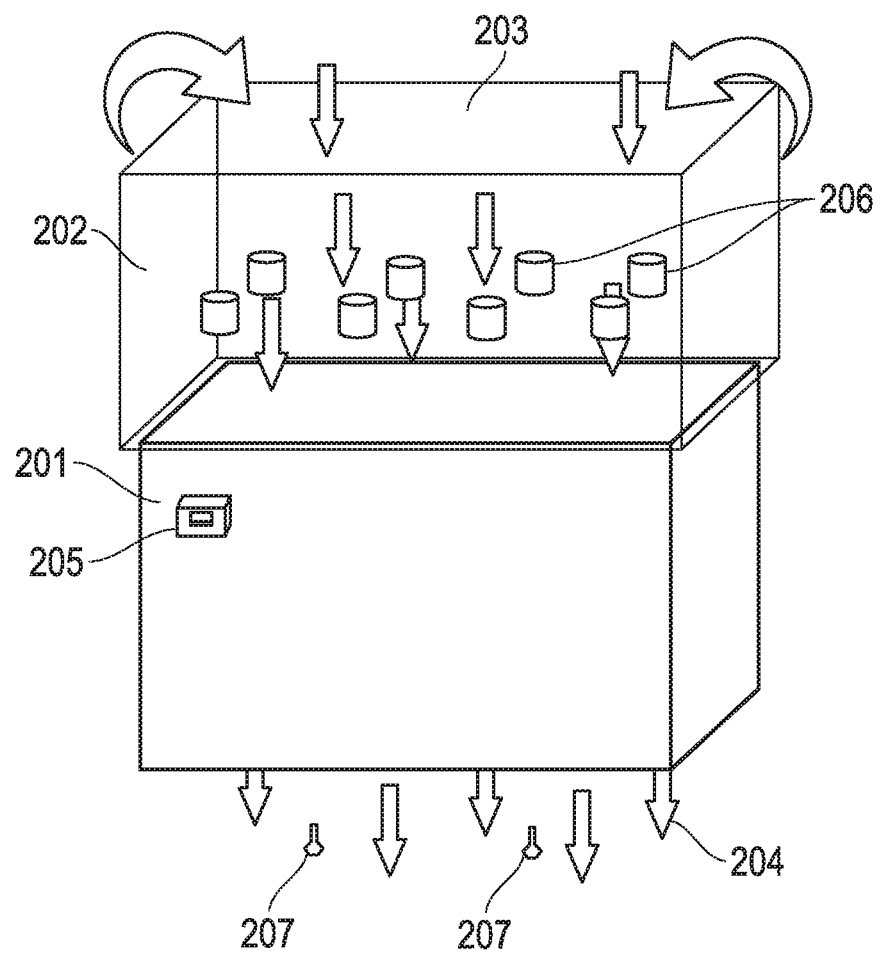
FIG. 2 is a graphic representation of the deployment and use of one embodiment of the cooling enthalpy gauge of the present invention.

Referring now to FIG. 2 which depicts the deployment and use of one embodiment of the cooling enthalpy gauge of the present invention. A CRAC unit 201 is configured with a return air duct 202. Warm air in the return air stream 203 enters the return air duct 202 and passes through the CRAC unit 201. Cool air in the supply air stream 204 then exits the CRAC unit 201.

The CRAC unit 201 is configured with one embodiment of the cooling enthalpy gauge controller 205 of the present invention. Although a variety of configurations are possible, in one embodiment, the controller 205 is configured to accept the input of ten mass air flow sensors and four temperature sensors. In that case, the controller 205 would be required to receive a 0-5 volt signal for each of the ten mass air flow sensors. Two of the temperature sensor inputs would be dedicated for return temperature and the remaining two temperature sensor inputs would be dedicated for the supply temperature. The temperature sensors and their electrical requirements could be any that are known in the art.

The cooling enthalpy gauge controller 205 is communicatively connected to a plurality of mass air flow sensors 206, such as those previously described, creating a MAF sensor array in return air stream 203. In addition, the CRAC unit 201 is configured with a plurality of mass air flow sensors 207, such as those previously described, creating a MAF sensor array in the supply air stream. Each of the mass air flow sensors 207 in the supply air stream 204 is also communicatively connected to the cooling enthalpy gauge controller 205.

In operation, the signal from the MAF sensors 206 in the return air stream 203 will be averaged together to create a single return signal. Similarly, the signal from the MAF sensors 207 in the supply air stream 204 will be averaged together to create a single supply signal. In either case, if a MAF sensor is not in communication with the cooling enthalpy gauge controller 205, the absence of the signal is not counted in the averaged reading.

Embodiments of the present invention use an array of mass air flow, temperature, humidity, and barometric sensors to read the air quantity and quality as it enters a CRAC unit and then compares those readings to the supply side sensors to calculate the change in enthalpy. More specifically, the controller 205 will compare the return signal to the supply signal from the MAF sensors to the temperature differential (ΔT) of the supply air stream 204 and return air stream 203 of the CRAC unit 201. The user may specify the desired exhaust temperature. The controller 205 also allows the end user to configure the sampling area, such as square inch. The user may also designate whether the area to be sampled is round, square or rectangular. For round sampling areas, the end user will enter in the diameter of the sampling area in inches and the controller 205 will determine the sampling area by using the formula $R^2 \times \pi$. For square or rectangle sampling areas, the end user will enter in the width and length.

The controller 205 will use the information input by the user to scale the output of the MAF sensors to lbs/min. The controller will then convert the lbs/min output to watts cooling capacity by the following formula:

$$((\text{MAF "lb/min"}) \times (\Delta H \text{ "btu/lb° F."})) \times 60/3.412$$

Where H is enthalpy, and the formula for calculating enthalpy is:

$$(0.24*\text{"° F."}) + (0.62198*(\text{"\% RH"}/100)*(\text{EXP} \\
((10440.4/(\text{"° F."}+459.67)-11.29465- \\
0.02702235*(\text{"° F."}+459.67)+0.00001289036* \\
(\text{"° F."}+459.67)^2 - 0.000000002478068*(\text{"° F."}+ \\
459.67)^3 + 6.545967*(\text{LN}(\text{"° F."}+459.67)))))/ \\
((\text{"P"}*14.7)-(\text{"\% RH"}/100)*(\text{EXP}((-10440.4/(\text{"° } \\
\text{F."}+459.67)-11.29465-0.02702235*(\text{"° F."}+ \\
459.67)+0.00001289036*(\text{"° F."}+459.67)^2 - \\
0.000000002478068*(\text{"° F."}+459.67)^3 + \\
6.545967*(\text{LN}(\text{"° F."}+459.67))))))*(1061+ \\
0.444*\text{"° F."}))$$

where: "° F."=Temperature in degrees Fahrenheit
"% RH"=Humidity in relative percentage
"P"=Barometric pressure measured in atmosphere Enthalpy must be calculated for return and supply air temperatures. The change in enthalpy, or ΔH, is determined by subtracting supply enthalpy from return enthalpy.

Turning now to the mass air flow signal, airflow from a fan/blower is delivered in a pulsing manner. Thus, in various embodiments, the MAF sensor will read the airflow in a pulsating/oscillating manner. To read the signal result, the MAF signal must be smoothed. Signal smoothing is achieved by averaging the oscillating signal over a user settable time period. In some embodiments, default time period may be 0.5 seconds. In any event, the signal from each MAF sensor must be smooth over a short user scalable period prior to averaging signals.

The controller 205 will also be configured with a display from which the user can input the settings and receive the results. This may be accomplished through a series of buttons (physical or I/O screen based) for end users to interact with the controller. Controller 205 may also include an internal web based client for remote configuration and access for monitoring. In some embodiments, the controller 205 may communicate using SNMP and Modbus IP protocols and use RJ45 and/or wireless connectors.

The controller 205 can display cooling production from a CRAC unit, in real time, and displayed in watts. The "watts" metric is used to simplify monitoring process by using consist units for cooling production, distribution and IT heat load (e.g. cabinet power strip).

Figure 3:
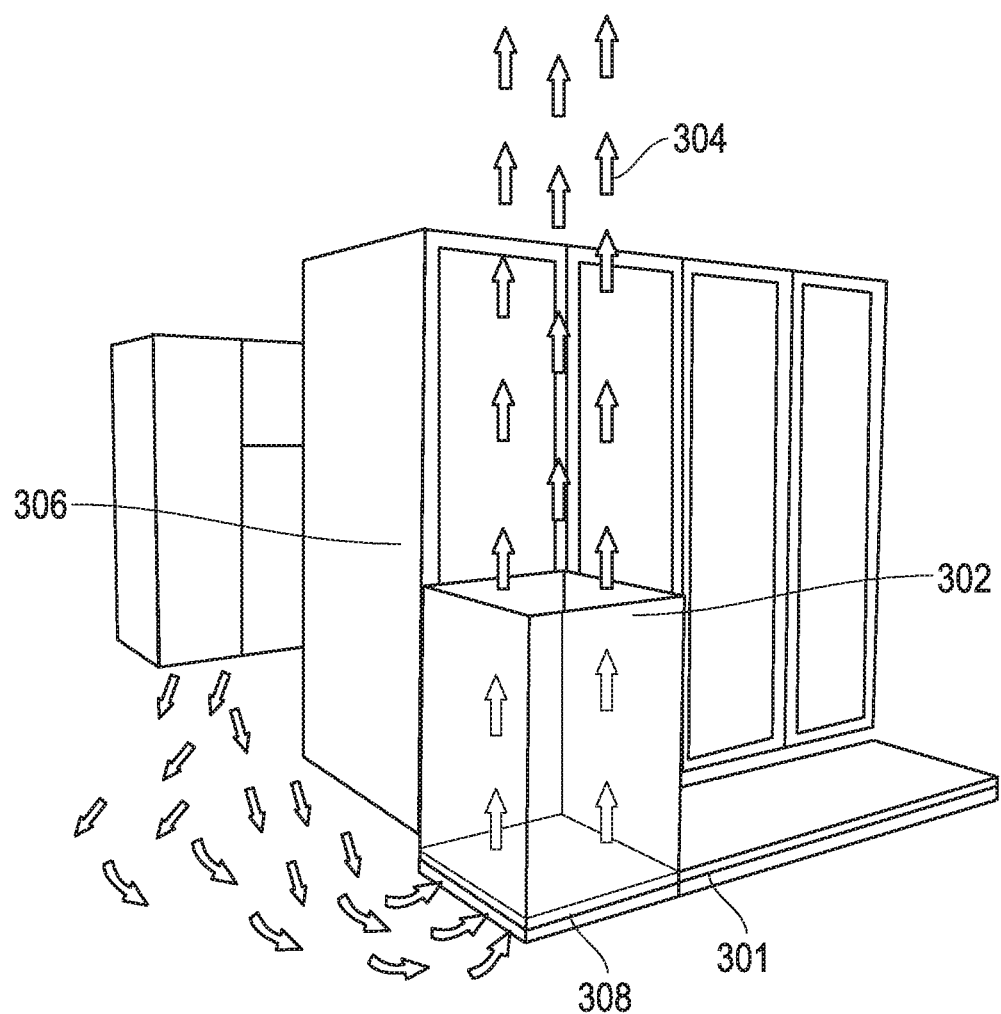
FIG. 3 is a graphic representation of the implementation of one embodiment of a flow hood of the present invention.

Referring now to FIG. 3, which depicts a computer room equipped with one embodiment of the cooling enthalpy gauge of the present invention. A plurality of mass air flow sensors 100 are positioned and a flow hood 301 which is positioned over a perforated floor tile or vent 303. Air 304 passes through the flow hood 301 for monitoring.

The controller 201 can be operated in different modes. For example, it can monitor and control CRAC unit cooling production in which it outputs the watts of cooling production. Alternatively, it can monitor and control cooling distribution, in which case, the user enters in a desired cabinet 305 exhaust air temperature into the controller 205 (example 85° F.). The CEG hood 302 is placed over a perforated floor tile or vent 303. The controller 205 will calculate watts of cooling distributed through the perforated floor tile or vent 303.

The methods and systems described herein provide a number of unique and beneficial features. For example, when used in conjunction with a BMS or DCIM solution which monitors cooling infrastructure power, the embodiments of the present invention can display a "cooling kW to kW power consumed" which is akin to a "miles per gallon" metric. Embodiments of the present invention can also identify inefficient cooling distribution by comparing % of water valve or compressor utilization, to the CRAC unit's rated capacity, and to the system's measured capacity.

Further, various embodiments can identify redundant cooling distribution issues by comparing cooling distribution readings between redundant cooling production scenarios (e.g., lead/lag configurations). Embodiments can also equip facilities managers with actionable information such as the most efficient means to cool the data center. For example, information can be provided to assist in determining whether is it better to turn off a CRAC unit, raise the temperature set point, or reduce variable fan speeds.

In addition, various embodiments can help identify CRAC unit installation and operation issues such as subfloor blockages, slipping belts, restrictive filters, short cycling, excessive humidification/dehumidification, over or under utilization and inappropriate temperature set point.

As can be appreciated from the foregoing disclosure, unlike previously described systems that are unable to provide exact measurements of CRAC unit utilization, various embodiments of the present invention provide an exact measurement of cooling production (enthalpy) which is compared to the compressor or chill water valve settings, fan speed, and CRAC unit rated capacity. As a result, the present invention can determine the cause of CRAC inefficiency. For example, a 105 kW rated CRAC unit is only provided 75 kW of cooling and is operating at 100% capacity. The return temperature is 69° F. and the supply temperature is 58° F. The cooling set point is 69° F. Embodiments of the present invention can determine that the CRAC unit is operating at 71% effectiveness and the causes of a low effectiveness rating are a low return air temperature and low temperature set point.

Also, unlike previously described systems that are unable to measure mass air flow cooling distribution at vents or perforated raised floor tiles, various embodiments of the present invention provide an array of mass air flow sensors in a flow hood positioned over the vent or perforated floor tile. A user enters the desired equipment exhaust temperature and the system of the present invention calculates the watts of cooling required based on the mass air flow distributed to that location compared to the desired enthalpy.

Finally, unlike previously described systems that are unable to effectively measure mass air flow and enthalpy change of data center load, various embodiments of the present invention allow an array of sensors to be located in a flow hood at the front of the equipment or equipment rack and another array of sensors will be placed in a hood at the exhaust side of the equipment or equipment rack. The system of the present invention measures the mass air flow at the inlet and compares it to the exhaust enthalpy change. The measured results are displayed in watts.

While the present system and method has been disclosed according to the preferred embodiment of the invention, those of ordinary skill in the art will understand that other embodiments have also been enabled. Even though the foregoing discussion has focused on particular embodiments, it is understood that other configurations are contemplated. In particular, even though the expressions "in one embodiment" or "in another embodiment" are used herein, these phrases are meant to generally reference embodiment possibilities and are not intended to limit the invention to those particular embodiment configurations. These terms may reference the same or different embodiments, and unless indicated otherwise, are combinable into aggregate embodiments. The terms "a", "an" and "the" mean "one or more" unless expressly specified otherwise. The term "connected" means "communicatively connected" unless otherwise defined.

When a single embodiment is described herein, it will be readily apparent that more than one embodiment may be used in place of a single embodiment. Similarly, where more than one embodiment is described herein, it will be readily apparent that a single embodiment may be substituted for that one device.

In light of the wide variety of methods for determining the method and system for managing cooling distribution known in the art, the detailed embodiments are intended to be illustrative only and should not be taken as limiting the scope of the invention. Rather, what is claimed as the invention is all such modifications as may come within the spirit and scope of the following claims and equivalents thereto.

None of the description in this specification should be read as implying that any particular element, step or function is an essential element which must be included in the claim scope. The scope of the patented subject matter is defined only by the allowed claims and their equivalents. Unless explicitly recited, other aspects of the present invention as described in this specification do not limit the scope of the claims.

What is claimed is:

1. A system for managing cooling distribution, comprising:
 a first array of sensor modules positioned in a return air stream;
 a second array of sensor modules positioned in a supply air stream;
 a controller communicatively connected to the first array of sensor modules and the second array of sensor modules;
 wherein mass air flow is measured by the controller through the first array of sensor modules;
 mass air flow is measured by the controller through the second array of sensor modules; and
 measurements from the first array of sensor modules are compared to measurements from the second array of sensor modules by the controller to calculate enthalpy gain or lost between the return air stream and the supply air stream.

2. The system of claim 1, wherein mass air flow includes temperature, pressure, water content and quantity of airflow.

3. The system of claim 1, wherein signals from each sensor in the first array of sensor modules are averaged to create a single signal before comparing to measurements from the second array of sensor modules.

4. The system of claim 1, wherein a sensor in the first array of sensor modules includes one or more communications ports, one or more mass air flow sensors, one or more temperature sensors, one or more relative humidity sensors, and one or more barometric sensors.

5. The system of claim 1, wherein, before measurements form the first array of sensor modules are compared to the measurements from the second array of sensor modules, a user specifies a sampling area.

6. The system of claim 1, wherein the first array of sensor modules are located within a flow hood and, before the measurements from the first array of sensor modules are compared to the measurements from the second array of sensor modules, a user specifies dimensions of the flow hood.

7. The system of claim 1, wherein enthalpy is displayed on the controller to a user in watts.

8. The system of claim 1, wherein mass air flow includes temperature, pressure, water content, and quantity of airflow and, before measurements from the first array of sensor modules are compared to measurements from the second array of sensor modules, the controller smoothes the quantity of airflow measurement to remove pulsations.

9. The system of claim 1, wherein a user can input settings and receive results through the controller.

10. The system of claim 1, where the controller includes an internal web-based client for remote configuration and access.

11. A method of managing cooling distribution, comprising:
 positioning a first array of sensor modules in a return air stream;
 positioning a second array of sensor modules in a supply air stream;
 communicatively connecting a controller to the first array of sensor modules and the second array of sensor modules;
 measuring mass air flow by the controller through the first array of sensor modules;
 measuring mass air flow by the controller through the second array of sensor modules; and
 and comparing the measurement from the first array of sensor modules to the measurements from the second array of sensor modules by the controller to calculate enthalpy gain or lost between the return air stream and the supply air stream.

12. The method of claim 11, wherein mass air flow includes temperature, pressure, water content and quantity of airflow.

13. The method of claim 11, wherein signals from each sensor in the first array of sensor modules are averaged to create a single signal before comparing to measurements from the second array of sensor modules.

14. The method of claim 11, wherein a sensor in the first array of sensor modules includes one or more communications ports, one or more mass air flow sensors, one or more relative humidity sensors, and one or more barometric sensors.

15. The method of claim 11, wherein, before measurements from the first array of sensor modules are compared to measurements from the second array of sensor modules, a user specifies a sampling area.

16. The method of claim 11, wherein, the first array of sensor modules are located within a flow hood and, before measurements from the first array of sensor modules are compared to measurements from the second array of sensor modules, a user specifies dimensions of the flow hood.

17. The method of claim 11, wherein the controller displays enthalpy to a user in watts.

18. The method of claim 11, wherein mass air flow includes temperature, pressure, water content and quantity of airflow and, before measurements from the first array of sensor modules are compared to measurements from the second array of sensor modules, the controller smoothes the quantity of airflow measurement to remove pulsations.

19. The method of claim 11, wherein a user can input settings and received results through the controller.

20. The method of claim 11, wherein the controller includes an internal web-based client for remote configuration and access.

* * * * *

UNITED STATES PATENT AND TRADEMARK OFFICE
CERTIFICATE OF CORRECTION

PATENT NO. : 9,915,570 B1  
APPLICATION NO. : 15/594155  
DATED : March 13, 2018  
INVENTOR(S) : Anthony Gennello Page 1 of 1

It is certified that error appears in the above-identified patent and that said Letters Patent is hereby corrected as shown below:

In the Specification

Column 3, Line 59 should read "CRAH", replacing --"CRAW"--.

Signed and Sealed this  
Fifteenth Day of May, 2018

Andrei Iancu  
*Director of the United States Patent and Trademark Office*